(12) United States Patent
Iwasaki

(10) Patent No.: US 7,161,854 B2
(45) Date of Patent: Jan. 9, 2007

(54) JITTER AND SKEW SUPPRESSING DELAY CONTROL APPARATUS

(75) Inventor: Keiichi Iwasaki, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/167,627

(22) Filed: Jun. 27, 2005

(65) Prior Publication Data
US 2005/0286320 A1 Dec. 29, 2005

(30) Foreign Application Priority Data
Jun. 28, 2004 (JP) .............................. 2004-189213

(51) Int. Cl.
*G11C 7/00* (2006.01)
(52) U.S. Cl. ................. 365/193; 365/189.05; 365/191; 365/194
(58) Field of Classification Search ............ 365/191 X, 365/193 O, 194 X, 189.05 X; 327/147, 327/149, 161, 162, 163; 375/355, 362, 375
See application file for complete search history.

(56) References Cited
U.S. PATENT DOCUMENTS
6,836,503 B1 * 12/2004 Best et al. ................... 375/355
2004/0222828 A1 * 11/2004 Ishikawa ..................... 327/156

\* cited by examiner

*Primary Examiner*—VanThu Nguyen
(74) *Attorney, Agent, or Firm*—Cooper & Dunham LLP

(57) ABSTRACT

A delay control apparatus includes first and second delay elements each configured to receive and delay a strobe signal and clock by a prescribed delay value. A prescribed number of flip-flops is provided to input data upon receiving the strobe signal output from the second delay element. The second delay element delays and outputs the strobe signal by the prescribed delay value to the flip-flops when the selection device selects the strobe signal. A phase comparator compares clocks output from the first and second delay elements. A delay control device changes the prescribed delay value of the second delay element in accordance with the comparison result of the phase comparator when the selection device selects the clock.

15 Claims, 12 Drawing Sheets

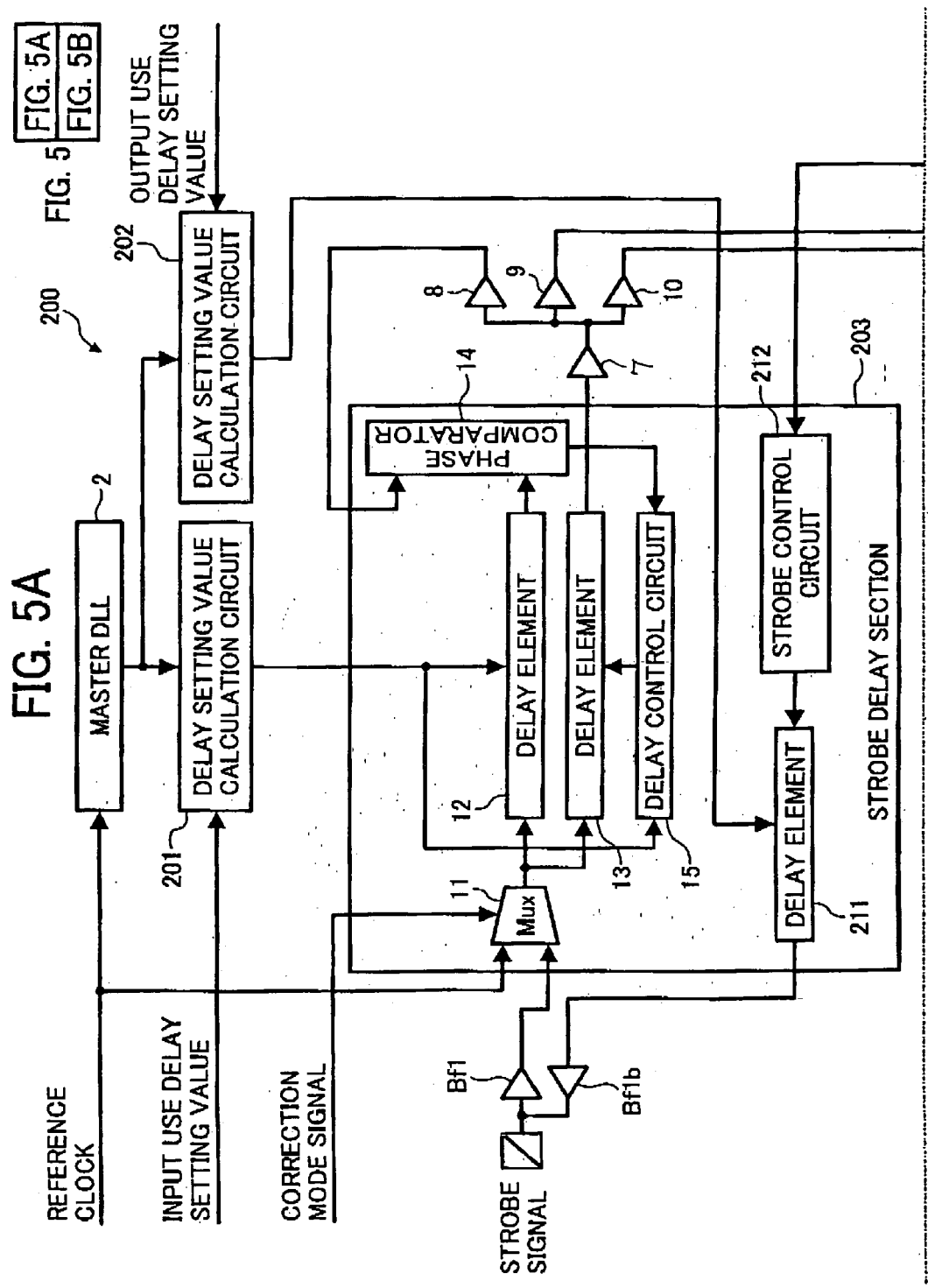

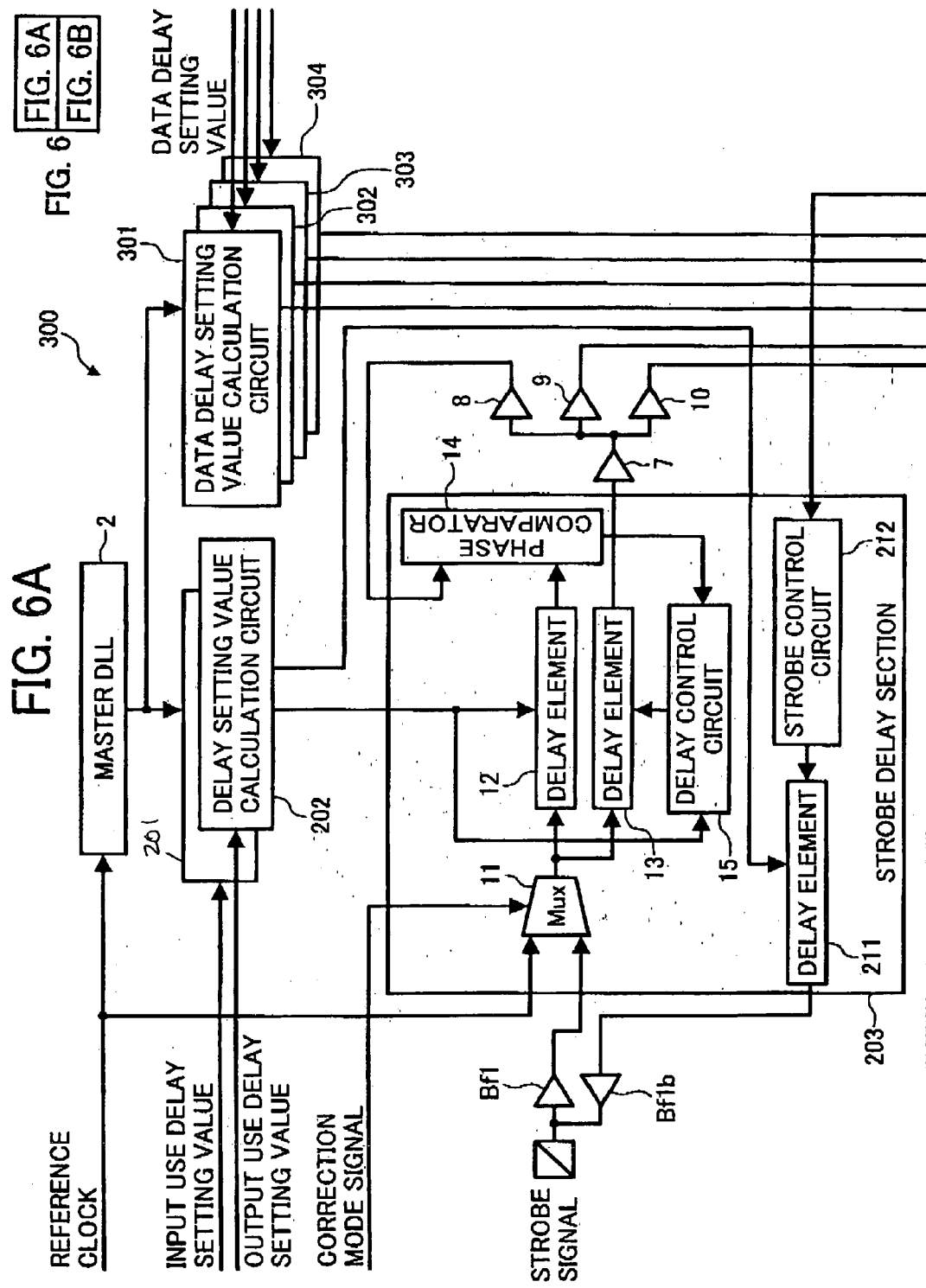

JITTER AND SKEW SUPPRESSING DELAY CONTROL APPARATUS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field

The present application relates to a delay control apparatus, and in particular to a delay control apparatus capable of readily and appropriately taking in data using a DLL (Delay Locked Loop) in synchronism with a clock or a strobe signal.

2. Background Art

In the past, data interfaces between a plurality of devices are performed such that data is communicated in synchronism with a single clock with its phase being controlled. Otherwise, a device outputs a strobe signal and data, and another device receives and takes in the data using the strobe signal.

Ultra DMA to a hard disc and data interface with a DDR (Double Data Rate)-SRAM are examples of the latter system. Among those, execution of the ultra DMA does not raise a serious problem in designing an ASIC having a hard disk interface, because a strobe signal operates at a maximum of 50 MHz even if using ultra DMA100.

However, when a DDR-SDRAM is utilized, it needs to receive data in synchronism with a high-speed (such as 400 MHz, 266 MHz, etc.) strobe signal. Further, since timing requirements of a strobe signal and data are strict, it is not commonly executed unless a private use mechanism is employed in designing an ASIC.

Further, a conventional technology is taught in "DDR SDRAM Functionality and Controller Read Data Capture," Micron Design Line, Volume 8, Issue 3 (3Q99) that uses a DLL as shown in FIGS. 8 and 9, wherein a structure implementing the method and data input timings are illustrated, respectively.

Specifically, as shown in FIG. 8, the conventional signal delay apparatus includes a DLL101, a delay setting calculation circuit 102, a delay element 103, four minimum delay elements 104 to 107, and four flip-flops 108 to 111 or the like when using data of four bits. The DLL101 includes a delay element 112, a phase comparator 113, and a delay control circuit 114 and the like.

The delay element 112 outputs an input clock to the phase comparator 113 with a delay of one cycle. The phase comparator 113 compares phases of clocks delayed and not delayed by the delay element 112, and outputs a comparison result to the delay control circuit 114. The delay control circuit 114 calculates a delay setting value that corresponds to one cycle of the clock based upon the comparison result, and outputs the calculation result to both the delay element 112 and the delay setting value calculation circuit 102.

The delay setting value calculation circuit 102 calculates a delay setting value for a delay element 103, which delays a strobe signal, based on a delay setting value input by the delay control circuit 114 and a gear ratio setting value. The delay setting value calculation circuit 102 outputs the calculation result to a delay element 103. The delay element 103 delays and outputs a strobe signal in accordance with the delay setting value input by the delay setting value calculation circuit 102 to the flip-flops 108 to 111 as corrected strobe signals.

Data 0 to 3 are input to respective minimum delay elements 104 to 107. The respective minimum delay elements 104 to 107 delay these data 0 to 3 by a prescribed value and output the delayed data to the flip-flops 108 to 111, respectively. Each of these minimum delay elements 104 to 107 has the same delay values as the delay element 103 having a delay value set to 0%.

When the above-mentioned gear ratio setting value is 45%, for example, the delay setting value calculation circuit 102 sets a delay value of 45% of the clock to the delay element 103. The delay element 103 then delays a strobe signal by the delay value and outputs the delaying result to the flip-flops 108 to 111. The delay elements 112 and 103 have the same configurations in the above-mentioned circuit. Further, input timings in the signal delay apparatus are illustrated in FIG. 9, wherein alpha-numeral "td" represents a delay value created by a delay element 103 for strobe use.

However, in such a conventional technology, when an ASIC is designed including a DLL and handles data of plural bits, data skew appears at among flip-flops when respective data and a corrected strobe signal are taken in by the flip-flops. Further, an amount of skew of respective data supplied from ASIC terminals to inputs of the flip-flop affects and changes a valid data width as shown in FIG. 9.

FIG. 10A illustrates a strobe delay timing, wherein alpha-numeral TDD represents delays created during when a plurality of data signals are input and reach the flip-flops 108 to 111 through the minimum delay elements 104 to 107. Alpha-numeral TD1 represents a strobe delay value, while alpha-numeral T1 represents a delay value set by the delay element 103 in FIGS. 10A and 10B. The delay element 103 includes jitter because a delay value T1 is determined by selecting a small delay unit as indicated by alpha-numeral J1. In a design of an ASIC it is commonly desirable that a delay TDD is constant in each of a plurality of data signals. Accordingly, as shown in FIG. 8, the flip-flops 108 to 111 are arranged in the vicinity of the minimum delay elements 104 to 107 so that a difference between delay TDDs in respective data lines can be negligible.

A problem often occurs in designing the ASIC. A strobe signal corrected by the delay element 103 is designed so that data skew up to respective flip-flops 108 to 111 can be decreased after output therefrom by using a clock tree synthesis. However, another problem is a long distance between the delay element 103 and the flip-flops 108 to 111, a delay between the delay element 103 and the flip-flops 108 to 111 largely varies depending upon changes in temperature and voltage as indicated by alpha-numeral J2 in FIG. 10B, wherein alpha-numeral TC corresponds to such a delay value.

Accordingly, a desired timing of a pair of margins M1A and M1B in relation to a valid data window TDW is shown in FIG. 10A. However, in practical design of the ASIC, balance and an amount of margin deteriorates and decreases in relation to the data window as shown by M2A and M2B in FIG. 10B.

Specifically, since there exists a delay value TC from the delay element 103 to the flip-flops 108 to 111 and a variation value J2 in the delay value, it is difficult to ensure that the delay TDD is constant in a plurality of data signals.

Further, a value of the delay TDD represents a delay value generated based on data input from the ASIC to the flip-flops 108 to 111 as shown in FIG. 8 at the desired timing of FIG. 10A. However, not all wiring distances from a plurality of data buses of a connected memory apparatus to a data bus of the ASIC are the same, and therefore skews commonly appear. Specifically, as shown in FIG. 11, even though the delay TDD is constant, each of timings of input of data 0 to 3 to the ASIC is different. Thus, a data window in which a strobe signal can appear becomes narrower as indicated by alpha-numeral TDWO in FIG. 11.

Accordingly, skews of data 0 to 3 need to be suppressed upon their input when an ASIC is designed.

SUMMARY

Accordingly, an object of the present application is to address and resolve the above-noted and other problems and provide a new delay control apparatus. Such a novel and unobvious delay control apparatus includes a selection device that selects and outputs one of a strobe signal and a clock in accordance with a selection signal, first and second delay elements, each receiving and delaying the strobe signal and the clock by a prescribed delay value, and a phase comparison device that compares phases of outputs of the first and second delay elements. A delay control device is provided to change the prescribed delay value of the second delay element. A prescribed number of flip-flops are provided to input data upon receiving the strobe signal output from the second delay element. The prescribed number corresponds to a number of inputs of the data. Further, the second delay element delays the strobe signal by the prescribed delay value and outputs the delayed signal to the flip-flops when the selection device selects the strobe signal. The phase comparator compares clocks output from the first and second delay elements, and the delay control device changes the prescribed delay value of the second delay element in accordance with the comparison result of the phase comparator when the selection device selects the clock.

In another embodiment, an output of the second delay element is input to the phase comparing device and flip-flops via at least one buffer. Further, the plurality of flip-flops collectively form a tree.

In another embodiment, two data delay elements each having a minimum delay value settable to the prescribed delay value of the first and second delay elements are connected to input terminals of the flip-flops.

In yet another embodiment, a delay value calculation device calculates a delay value based upon a delay value of integral multiple cycles of the clock and a delay setting value that adjusts the delay value, and outputs the delay value to the first delay element and the delay control device. Further, the delay control device adjusts the prescribed delay value of the second delay element based upon the delay value output by the delay value calculation device and the comparison result of the phase comparing device.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein:

FIGS. 5A and 5B collectively illustrate an exemplary circuit of a delay control apparatus according to a third embodiment;

FIGS. 6A and 6B collectively illustrate an exemplary circuit of a delay control apparatus according to a fourth embodiment;

DISCUSSION OF PREFERRED EMBODIMENTS

Figure 1:
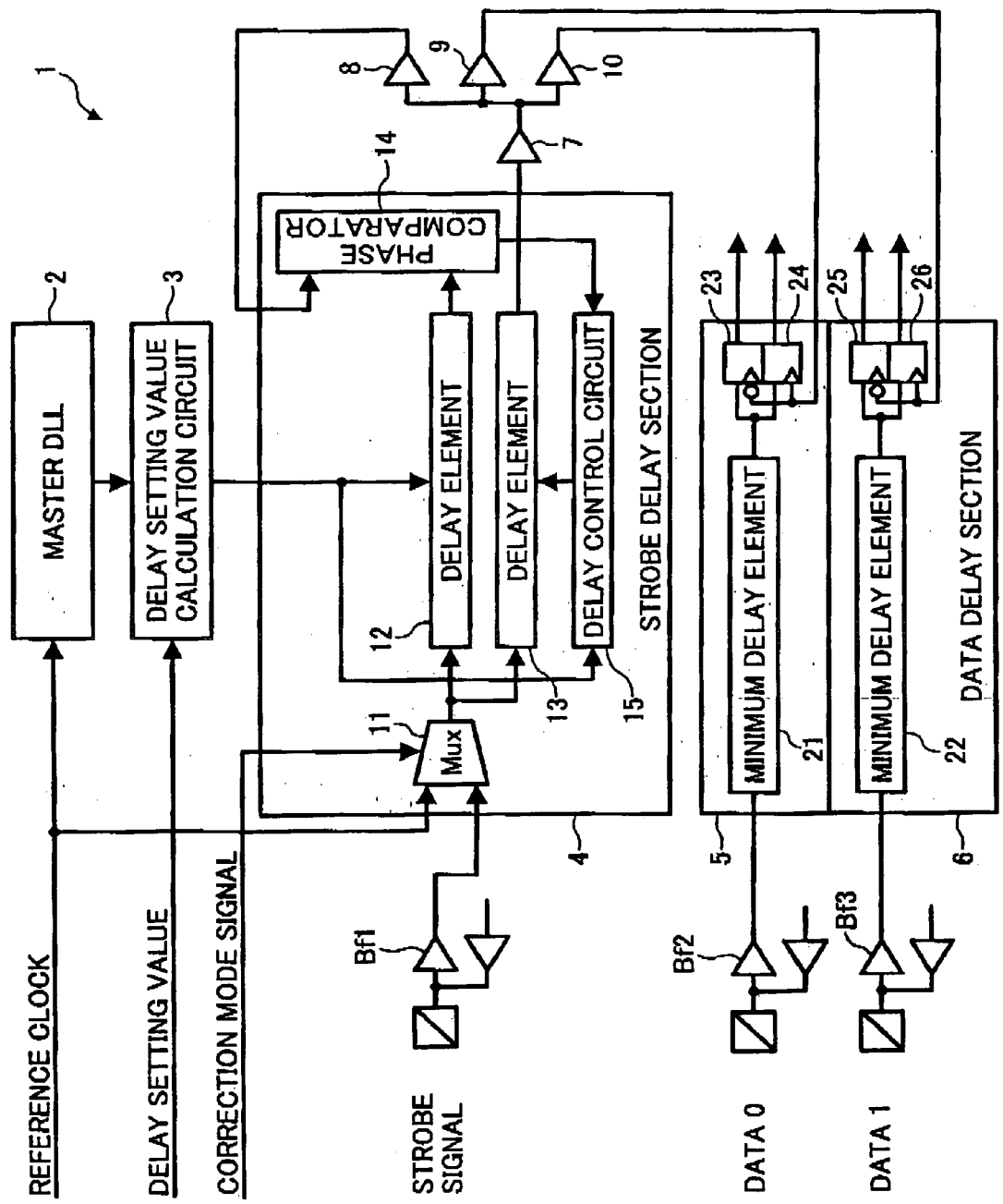
FIG. 1 illustrates an exemplary circuit of a delay control apparatus according to a first embodiment of the present application.

Referring now to the drawings, wherein like reference numerals and marks designate identical or corresponding parts throughout several figures, in particular in FIG. 1, an exemplary circuit of a delay control apparatus 1 according to a first embodiment of the present application is illustrated.

As shown, a delay control apparatus 1 includes a master DLL 2, a delay setting value calculation circuit 3, a strobe delay section 4, two data delay sections 5 and 6, and four buffers 7 to 10 or the like.

The strobe delay section 4 includes a MUX (multiplexer) 11, two delay elements 12 and 13, a phase comparator 14 and a delay control circuit 15. The data delay sections 5 and 6 include minimum delay elements 21 and 22, and flip-flops 23 to 26, respectively.

The master DLL 2 receives an input of a reference clock, and creates a delay having a value corresponding to one cycle of a reference clock, and then outputs the delaying result to a delay setting value calculation circuit 3.

The delay setting value calculation circuit (i.e., a delay value calculation device) 3 receives inputs of a delay setting value and a delay value from the master DLL2, and calculates another delay setting value for a strobe signal based upon the input delay setting value and the delay value. The delay setting value calculation circuit 3 then outputs the delaying result to the delay element 12 and the delay control circuit 13.

The strobe delay section 4 receives the reference clock (i.e., clock) and a strobe signal, as well as a correction mode signal as a switching signal at the MUX 11.

The MUX 11 then switches the reference clock and the strobe signal based upon the correction mode signal, and commonly outputs one of those to the delay elements 12 and 13. Specifically, the MUX 11 selects and outputs the reference clock to the delay elements 12 and 13 when the correction mode signal is active, i.e., in a correction mode. The strobe signal is input to the MUX 11 through a buffer Bf1.

The delay element (i.e., a first delay element) 12 delays the reference clock or the strobe signal by the delay setting value input from the delay setting value calculation circuit 3 and outputs the delaying result to the phase comparator 14.

The delay value of the delay element 12 is set so that a delay of a strobe signal created from the input terminal of the delay element 12 to that of the phase comparator 14 can be accurate.

The delay control circuit 15 sets the delay setting value input from the delay setting value calculation circuit 3 to the delay element 13 while either increasing or decreasing the delay setting value by a unit in accordance with a delay correction value input from the phase comparator 14.

The delay element 13 delays a reference clock or a strobe signal input from the MUX 11 by a correction delay value input from the delay control circuit 15, and outputs the delaying result to a phase comparator 14 via the buffer 7 and 8. The delay element 13 simultaneously outputs the delaying result to the flip-flops 23 and 24 via the buffers 7 and 10 as well as the flip-flops 25 and 26 via the buffers 7 and 9.

The phase comparator 14 receives and compares the output of the delay element 12 to the output of the delay element 13 received via the buffers 7 and 8. When the phase comparator 14 determines that the output of the delay element 13 is slower than that of the delay element 12, the phase comparator 14 outputs a delay correction value that increases a delay value currently set to the delay control circuit 15 by a unit, to the delay control circuit 15. Such a currently set delay value is initially set to the same value as the delay element 12 and is stored. In contrast, when the phase comparator 14 determines that the output of the delay element 13 is earlier than that of the delay element 12, the phase comparator 14 outputs a delay correction value that decreases a delay value currently set to the delay control circuit 15 by a unit, to the delay control circuit 15. Hereinafter, determination that the output of the delay element 13 is slower than that of the delay element 12 is represented as positive determination, while determination that the output of the delay element 13 is earlier than that of the delay element 12 is represented as negative determination.

The delay control circuit 15 changes a delay setting value currently set to a delay element 13 by either increasing or decreasing by a unit of setting in accordance with a delay correction value determined by the positive or negative determinations.

Data 0 is input to the minimum delay element 21 via a buffer Bf2. An output of the minimum delay element 21 is input to date input terminals of the flip-flops 23 and 24, while a strobe signal from the delay element 13 is input to clock input terminals of the flip-flops 23 and 24 via the buffers 7 and 10. The minimum delay element 21 delays the data "0" by a value that equalizes a delay value from an input of a strobe signal through the clock input terminals of the flip-flops 23 and 24 with that from an input of data to the data input terminals of the flip-flops 23 and 24 when the delay value is minimum. The minimum delay element 21 then outputs the delaying result to the data input terminals of the flip-flops 23 and 24. The flip-flops 23 and 24 output data 0 input by the minimum delay element 21 in response to a strobe signal input from the delay element 13.

Data 1 is input to the minimum delay element 22 via a buffer Bf3. An output of the minimum delay element 22 is input through a date input terminal of the flip-flops while a strobe signal from the delay element 13 is input to clock input terminals of the flip-flops 25 and 26 via the buffers 7 and 10. The minimum delay element 22 delays the data "1" by a value that equalizes a delay value from an input of a strobe signal to the clock input terminals of the flip-flops 25 and 26 with that from an input of data through the data input terminals of the flip-flops 25 and 26 when the delay value is minimum. The minimum delay element 22 then outputs the delaying result to the data input terminals of the flip-flops 25 and 26. The flip-flops 25 and 26 output data 1 input from the minimum delay element 22 in accordance with a strobe signal input from the delay element 13.

Figure 2:
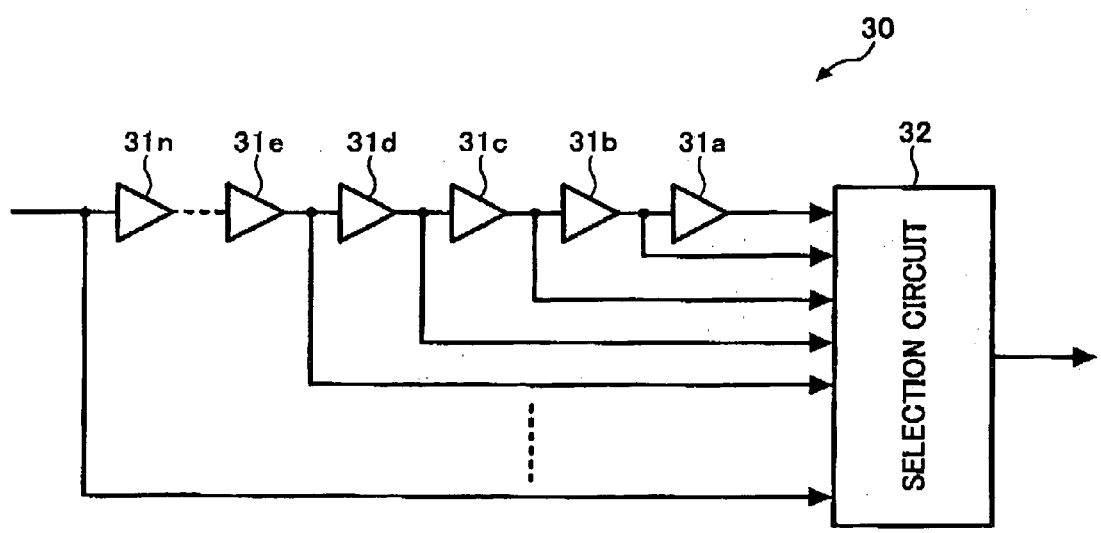
FIG. 2 illustrates an exemplary circuit of a delay element of FIG. 1.

A delay element 30 as shown in FIG. 2 can be employed as delay elements 12 and 13. The delay element 30 includes a plurality of unit delay elements 31a to 31n and a selection circuit 32. The selection circuit 32 selects one or more unit delay elements 31a to 31n in accordance with a set delay value, and the delay element 30 outputs the data or the strobe signal delayed by the selected one or more unit delay elements 31a to 31n.

In the strobe delay section 4 of the above-mentioned configuration, an output of the delay setting value calculation circuit 3 is connected to the delay control circuit 15, and the delay control circuit 15 initially sets the delay value of the delay element 13 to the same delay value as that of the delay element 12. However, a configuration of the strobe delay section 4 is not limited to the above. Specifically, the delay control circuit 15 is not necessarily connected to the delay setting value calculation circuit 3, because a delay value can be set to the delay element 13 by previously setting an initial delay value to one of the delay element 13 and the delay control circuit 15, or is stored in a memory or the like.

Further, wiring from the delay element 13 to input terminals of the respective flip-flops and the phase comparator 14 can be formed in a tree-like structure using clock tree synthesis so as to decrease skew.

Now, an exemplary operation according to another embodiment is described. In the delay control apparatus 1, a value of delay in a strobe signal created from an input terminal of a delay element 12 to that of a phase comparator 14 is accurately set, and a value of delay from an input terminal of a delay element 13 to that of the phase comparator 14 via the buffers 7 and 8 is set again to be accurate.

In an ordinary mode signal of the delay control apparatus 1, a correction mode is not active. Thus, a MUX 11 selects a strobe signal, and the delay element 13 delays the strobe signal by a delay value set by the delay control circuit 15. The delay element 13 outputs delaying result to flip-flops 23 and 24 via the buffers 7 and 10, and to flip-flops 25 and 26 via the buffers 7 and 9.

The pair of flip-flops 23 and 24 and the pair of flip-flops 25 and 26 output data 0 and 1 respectively delayed by the delay elements 13 and 21 and by the delay elements 13 and 22, in synchronism with a strobe signal input through the buffer 7 and 9 or the buffers 7 and 10.

When a correction mode signal is active at prescribed correction timing, the MUX 11 selects and outputs a reference clock to the delay elements 12 and 13.

The delay element 12 delays the reference clock by a value calculated by the delay setting value calculation circuit 3 based on a delay value, which corresponds to one cycle of the reference clock and is generated by the master DLL 2, and a delay setting value. The delay element 12 then outputs the delaying result to the phase comparator 14. The delay value of the delay element 12 is set so that a value of delay of a strobe signal created from an input terminal of the delay element 12 to that of the phase comparator 14 can be accurate.

Further, the delay element 13 delays the reference cloak by a value set by the delay control circuit 15 and inputs delaying result to the phase comparator 14 via the buffers 7 and 8. A value of delay from the delay element 13 to the input terminal of the phase comparator 14 via the buffers 7 and 8 is set to the same value as that of delay from the delay element 13 to an input terminal of the flip-flops 23 and 24 via the buffers 7 and 10 as a route for a strobe signal, as well as that of delay from the delay element 13 to the input terminals of the flip-flops 25 and 26 via the buffers 7 and 9.

The phase comparator 14 compares a phase of a reference clock input after being delayed by the delay element 12 by an accurate delay value for the strobe signal with that of a reference clock input from the delay element 13 via the buffers 7 and 8. The phase comparator 14 executes the above-mentioned positive or negative determination, and outputs a prescribed delay correction value to the delay control circuit 15 that either increases or decreases a delay value currently set to the delay control circuit 15 by a unit in accordance with the positive or negative determination.

The delay control circuit 15 then either sets an increased or decreased delay value by the unit to the delay control circuit 13 in accordance with the positive or negative determination.

As mentioned above, the delay element 13 delays the reference clock input from the MUX 11 by a set delay value from the circuit 15, and outputs the delaying result to the phase comparator 14 via the buffers 7 and 8.

Accordingly, an instance when the determination of the phase comparator 14 changes from the positive to the negative indicates that the delay value including those of the delay element 13 and the buffers 7 and 9 and wiring delay is in accord with that of the delay element 12. At this moment, the delay value from when a strobe signal leaves the delay element 13 to when it reaches the flip-flops 23 and 24, or the flip-flops 25 and 26 is in accord with the accurate delay value.

Thus, an accurate strobe delay can be maintained if the above-mentioned correction is periodically executed.

Thus, a value of delay from an input terminal of the delay element 12 to the phase comparator 14 is in accord with that from an input terminal of the delay element 13 to the phase comparator 14 via the buffers 7 and 8 or a buffer tree structure. Simultaneously, a value of delay from an input terminal of the delay element 12 to the phase comparator 14 is in accord with that from an input terminal of the delay element 13 to clock input terminals of the flip-flops 23 to 26 via the buffers 7 and 10, 7 and 9, or a buffer tree structure.

Figure 10A:
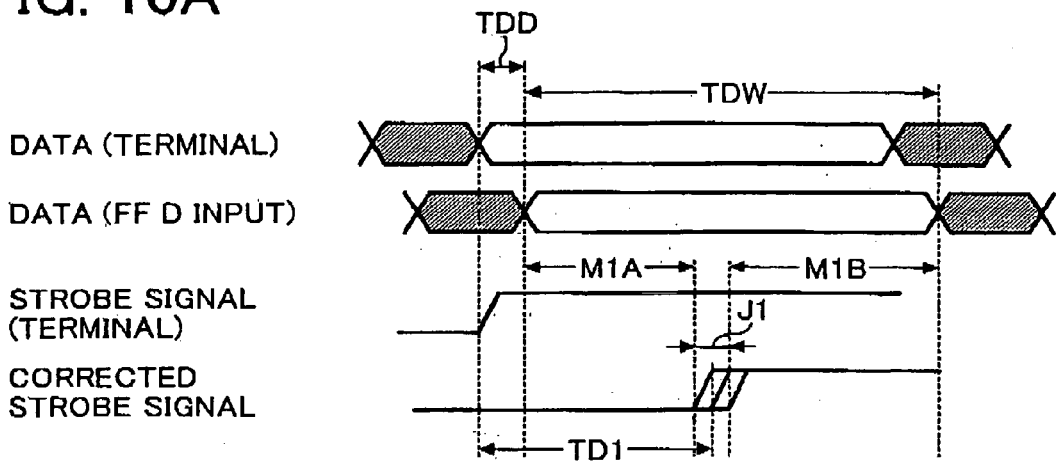
FIG. 10A illustrates a timing A when delay of a strobe signal is accurate.
Figure 10B:
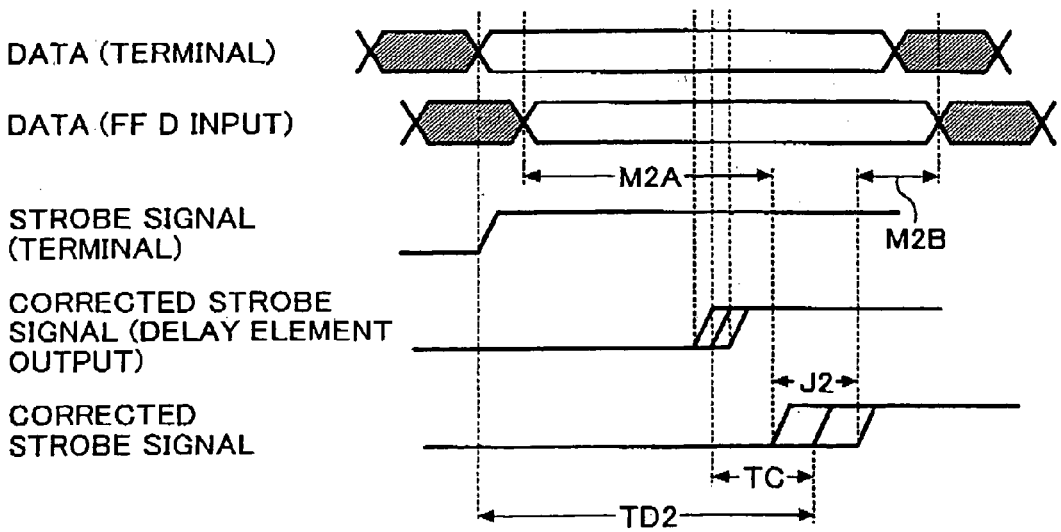
FIG. 10B illustrates a timing B when a margin appears in relation to the accurate timing.
Figure 11:
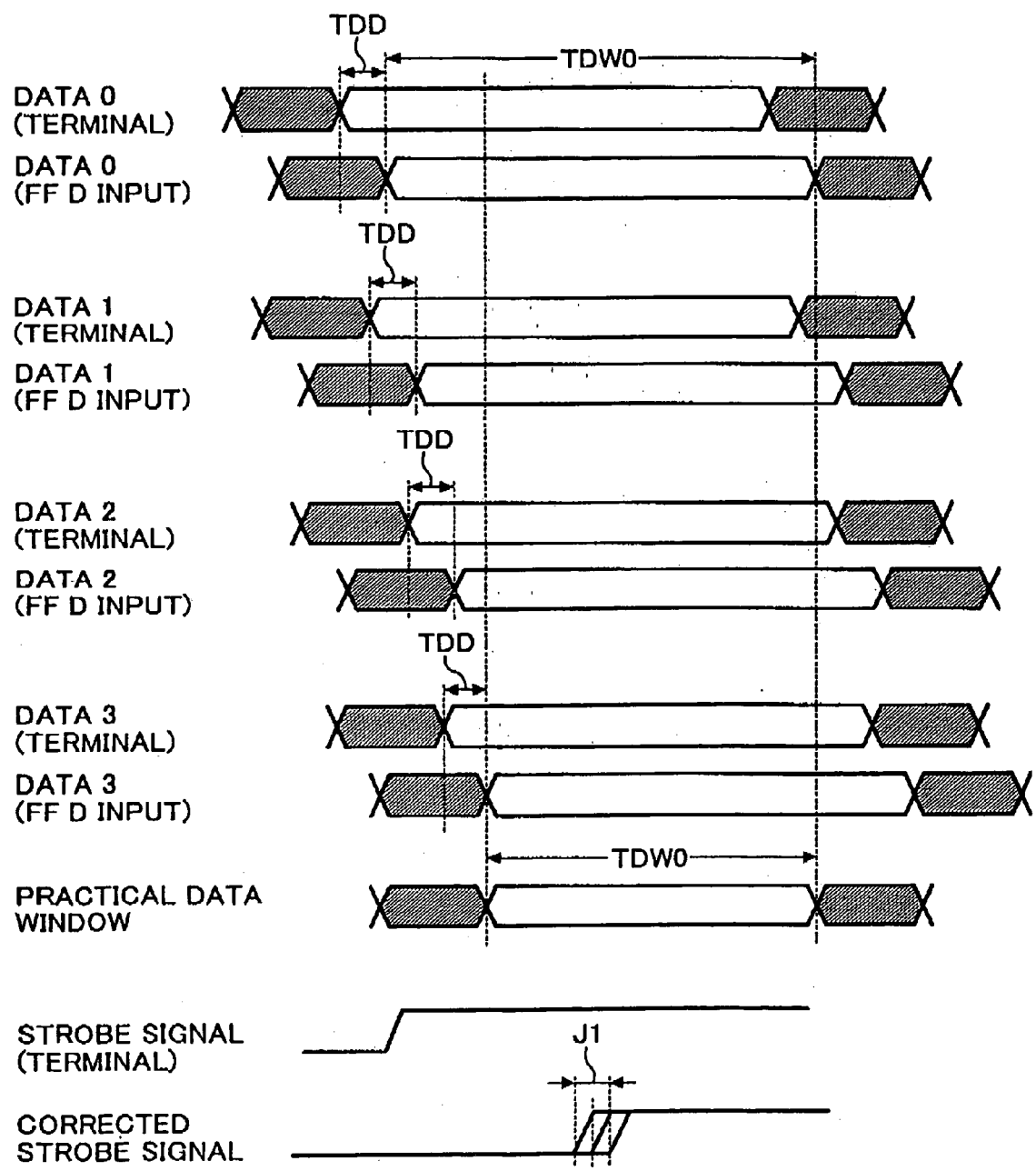
FIG. 11 illustrates effect of data skew at timings of data transfer.

Accordingly, a strobe signal can intentionally be delayed by a prescribed value before reaching the clock input terminals of the flip-flops 23 to 26. Further, a delay of a strobe signal up to flip-flops 23 to 26 conventionally corresponds to a jitter J2 shown in FIG. 10B. However, it can be suppressed into a jitter J1 shown FIG. 10A according to this embodiment.

Further, the delay elements 12 and 13 cannot provide zero delay even if set to the minimum delay value. However, according to the delay control apparatus 1 of one embodiment of the present application, since data 0 and 1 are input to the pair of flip-flops 23 and 24 and the pair of flip-flops 25 and 26 via the minimum delay elements 21 and 22, respectively, a delay value from an input of a strobe signal to the clock input terminals of the flip-flops 23 to 26 when the delay elements 12 and 13 have the minimum delay value can be equalized with the delay from an input of data to data input terminals of the flip-flops 23 to 26.

Further, the pair of flip-flops 23 and 24 and the pair of flip-flops 25 and 26 connected to the output terminal of the delay element 13 via the buffers 7 and 9 and the buffers 7 and 10, respectively, can include rise up edge and drop edge types. The output of the delay element 13 can include two systems of positive and negative logics. Further, a number of flip-flops 23 to 26 connected to outputs of the minimum delay elements of 21 and 22 of FIG. 1 can be optionally selected.

Figure 3:
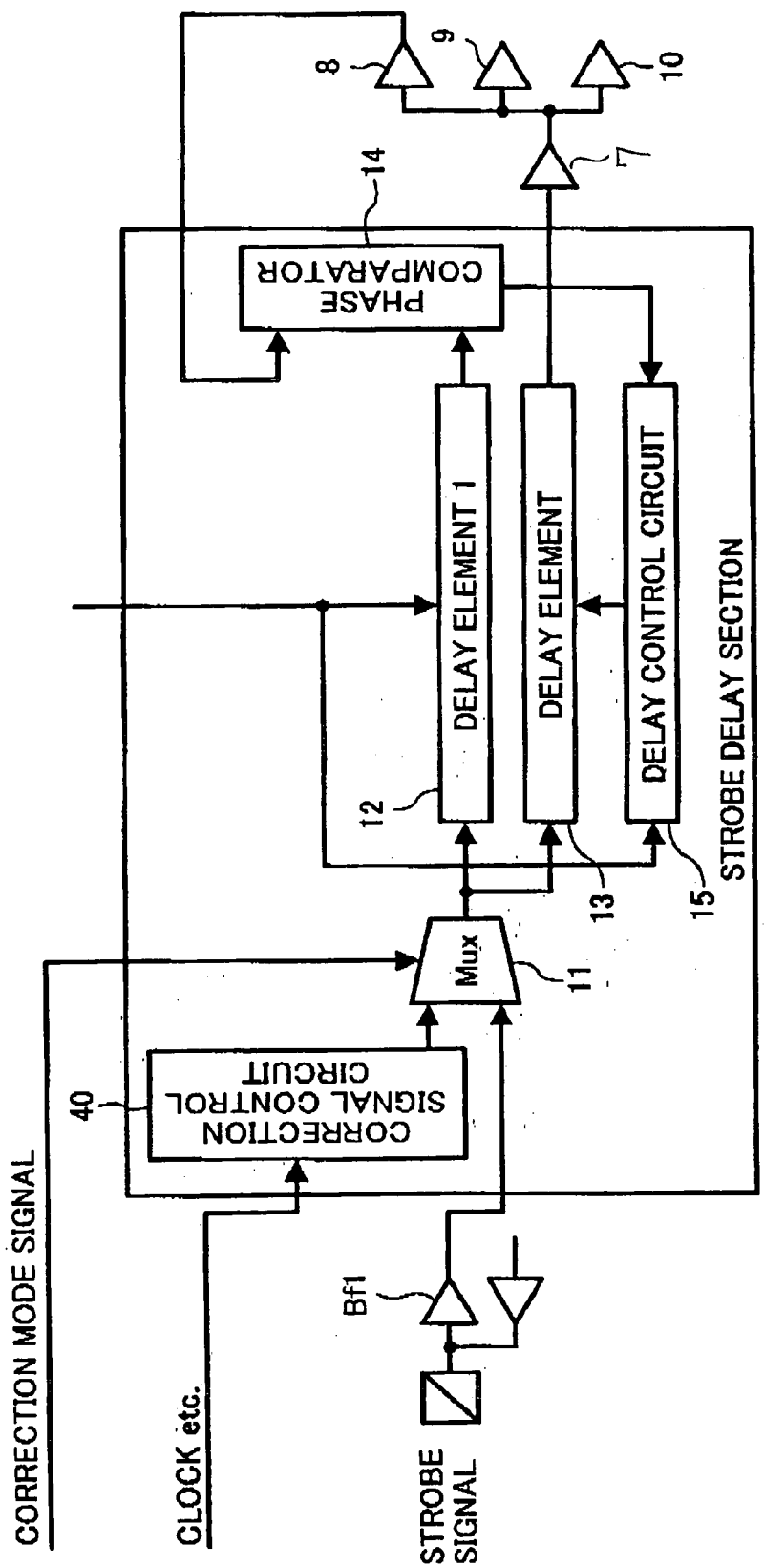
FIG. 3 illustrates an exemplary circuit of a strobe delay section of FIG. 1.

Further, as mentioned above, the strobe delay section 4 executes correction of a delay value of the delay element 13 in accordance with the reference clock. However, it is not limited to such a correction manner executed based on the reference clock, and a correction signal control circuit 40 can be provided to output a correction signal switching between Low to High, and vice versa as shown in FIG. 3. Specifically, the above-mentioned correction can be similarly performed by outputting a correction signal to the delay elements 12 and 13 via the MUX 11 when the correction mode signal is active.

As a result, a delay value from the delay element 13 to the phase comparator 14 can be equalized with that set to the delay element 12, while a delay value from the delay element 13 to flip-flops 23 to 26 can be equalized with a reference delay value of the delay element 12. Thus, jitters of clock inputs of the flip-flops 23 to 26 can be determined and controlled only by the delay elements 12 and 13, thereby appropriately enabling data transfer.

As mentioned above, the delay control apparatus 1 according to one exemplary embodiment inputs an output of the delay element 13 to the flip-flops 23 to 26 via the buffers 7 to 10.

Accordingly, delays from the delay element 13 to the flip-flops 23 to 26 can be suppressed by equalizing a delay value from the delay element 13 to the phase comparator 14 with that from the delay element 13 to the flip-flops 23 to 26. In addition, data transfer can be appropriately performed, while the data and the strobe signal are appropriately synchronized by enabling appropriate correction of displacement caused by a skew between data and a strobe signal.

Figure 4:
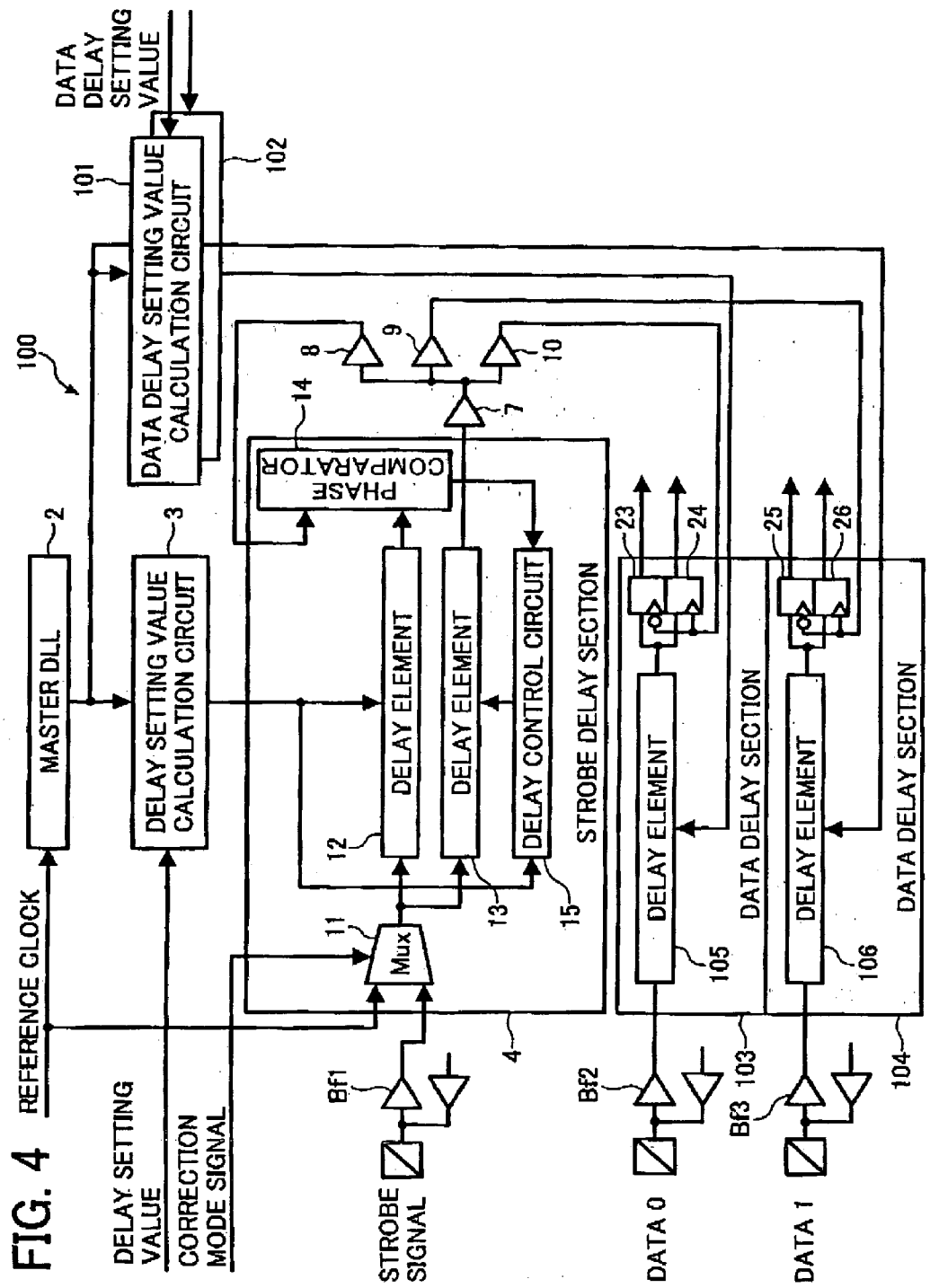
FIG. 4 illustrates an exemplary circuit of a delay control apparatus according to a second embodiment.

Now, a second embodiment of an exemplary delay control apparatus is described with reference to FIG. 4. As shown, a delay control apparatus 100 includes a master DLL 2, a delay setting value calculation circuit 3, and a strobe delay section 4 similar to the delay control apparatus 1 of the first embodiment. The delay control apparatus 100 further includes two data delay setting value calculation circuits 101 and 102, and two data delay sections 103 and 104.

The data delay section 103 includes a delay element 105, and two flip-flops 23 and 24 as in the data delay section 5 of the first embodiment. The data delay section 104 includes a delay element 106, and two flip-flops 25 and 26 as in the data delay section 6 of the first embodiment.

The delay elements 105 and 106 have similar configurations as the delay elements 12 and 13 of the first embodiment, and are provided to adjust respective skews of data input signals input to the two data delay sections 103 and 104. Accordingly, a delay unit of the maximum value set by the delay elements 105 and 106 can be smaller than that set by the delay elements 12 and 13.

The data delay setting value calculation circuits 101 and 102 receive inputs of delay values corresponding to one cycle of a reference clock from the master DLL 2 and a data delay setting value. The data delay setting value calculation circuits 101 and 102 calculate delay values corresponding to a data delay setting value based on the delay value input from the master DLL 2, and set the calculation result to the delay elements 105 and 106.

The delay values set to the delay elements 105 and 106 each represents a delay value for adjusting a skew of the data input signal input to each of a plurality of data delay sections 103 and 104 as mentioned above. The delay elements 105 and 106 delay data 0 and 1 upon input by the set delay value, respectively, and output delaying result to the pair of flip-flops 23 and 24 and the pair of flip-flops 25 and 26, respectively.

Thus, according to the exemplary delay control apparatus 100, the delay elements 105 and 106 are connected to data input terminals of the flip-flops 23 to 26. Each of the delay setting value calculation circuits 3, 101, and 102 is provided each to calculate a delay value based on a delay value corresponding to integral multiple cycles of a clock and a delay setting value that represents a value to either increase or decrease the delay value. The delay value calculated by the delay setting value calculation circuit 3 is used to set the delay element 12, while those calculated by the delay setting value calculation circuits 101 and 102 are used to set the delay elements 105 and 106.

Accordingly, a delay by M % of a clock cycle can be separately set per a data signal for a plurality of data. Thus, a skew of a data signal can be corrected, even if appearing on a transmission channel starting from a delay element 13 to the respective flip-flops 23 to 26. As a result, data transfer can be appropriately executed at low cost.

Figure 5B:
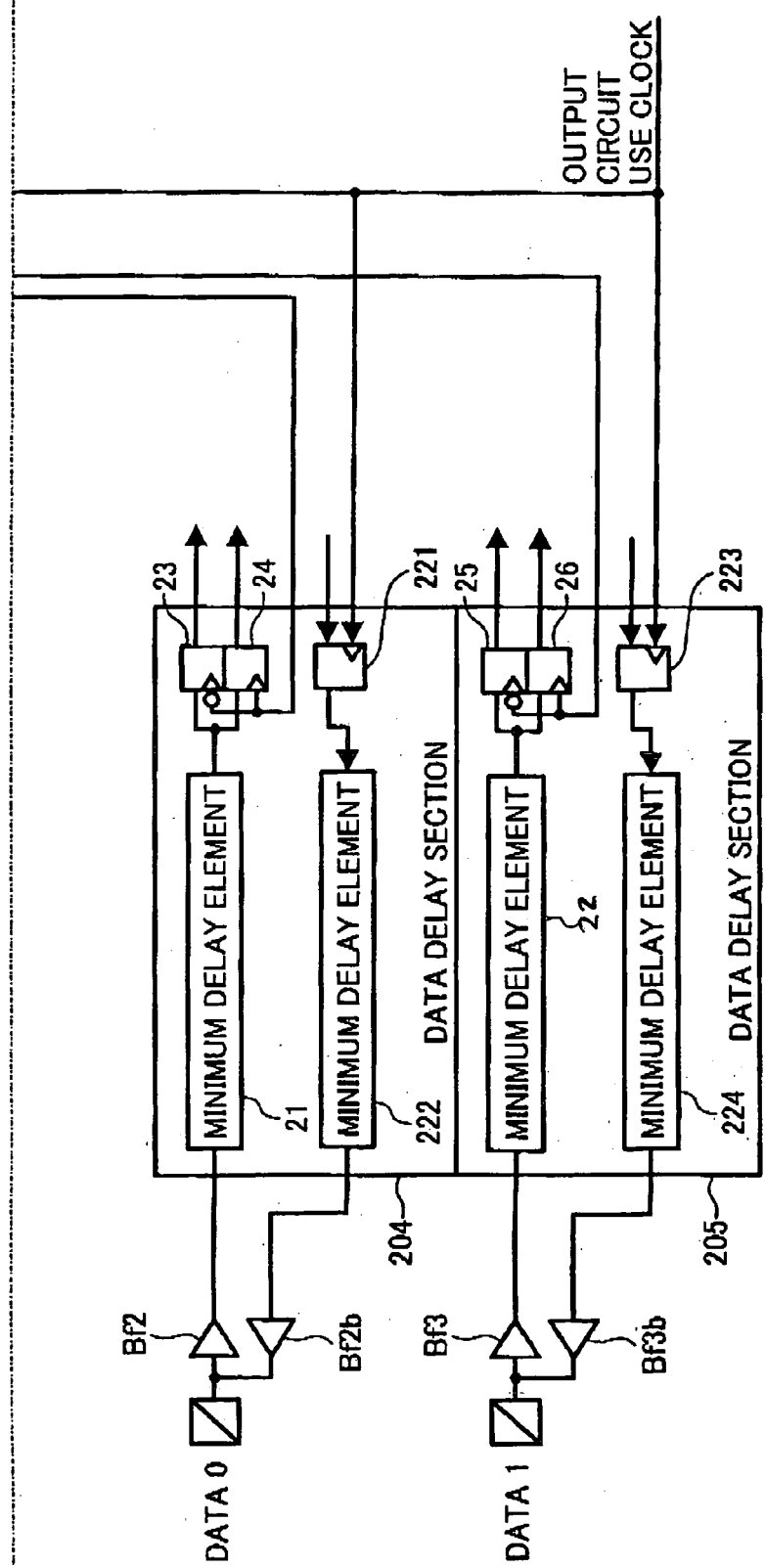

A third embodiment of an exemplary delay control apparatus is now described with reference to FIG. 5A and FIG. 5B.

As shown, a delay control apparatus 200 includes a master DLL 2, and four buffers 7 to 10 similar to the delay control apparatus 1 of the first embodiment. The delay control apparatus 200 further includes two delay setting value calculation circuits 201 and 202 for input and output uses, respectively, a strobe delay section 203, and two data delay sections 204 and 205.

The strobe delay section 203 includes a MUX 11, two delay elements 12 and 13, a phase comparator 14, and a delay control circuit 15 as in the strobe delay section 4 of the first embodiment. The strobe delay section 203 further includes a delay element (i.e., a strobe delay element) 211, and a strobe control circuit 212.

Further, the data delay section 204 includes a minimum delay element 21 and two flip-flops 23 and 24 as in the data delay section 5 of the first embodiment. The data delay section 204 further includes a flip-flop 221, and a minimum delay element 222 as a second data delay element. The data delay section 205 includes a minimum delay element 22, and two flip-flops 25 and 26 as in the data delay section 6 of the first embodiment. The data delay section 205 further includes a flip-flop 223, and a minimum delay element 224 as a second data delay element.

The delay setting value calculation circuit 201 receives a delay value corresponding to one cycle of a reference clock from the master DLL 2 and an input use delay setting value. The delay setting value calculation circuit 201 then calculates an input use delay value based upon the delay value input from the master DLL 2 and the input use delay setting value, and outputs the calculation result to the delay element 12 and the delay control circuit 15.

The delay setting value calculation circuit 202 receives a delay value corresponding to one cycle of a reference clock from the master DLL 2 and an output use delay setting value. The delay setting value calculation circuit 202 then calculates an output use delay value based upon the delay value input from the master DLL 2 and the output use delay setting value, and then outputs the calculation result to the delay element 211.

The strobe control circuit 212 receives an output circuit use clock and outputs a strobe output timing signal to the delay element 211 in response to the output circuit use clock.

The delay element 211 receives and delays the strobe output timing signal by the delay value input from the delay setting value calculation circuit 202 and returns the delaying result to the strobe signal line via the buffer Bf1b.

The flip-flops 221 and 223 respectively receive inputs of the output circuit use clock, and output the data output timing signal to the minimum delay elements 222 and 224 per the output (circuit) use clock.

The minimum delay elements 222 and 224 include the same functions as those of minimum delay elements 21 and 22, and delay the data output timing signal input from the flip-flops 221 and 223 by the same delay value as the minimum delay elements 21 and 22, and return those to the inputs of data 0 and data 1 via the buffers Bf2b and Bf3b, respectively.

Accordingly, a strobe output signal can also have a prescribed delay in relation to a data output signal. Further, a timing difference (i.e., a difference in delay) between the data output signal and the strobe output signal can be a delay value set by the delay setting value calculation circuit 202 to the delay element 211. Thus, according to the delay control apparatus 200 of this embodiment, the plurality of delay setting value calculation circuits 201 and 202 calculate delay values based upon the delay value corresponding to integral multiple cycles of a clock and a delay setting value that represents a value to either increase or decrease the delay value. Further, a delay value calculated by one of the plurality of delay setting value calculation circuits 201 and 202 is used to set the delay element 211 to delay an input strobe signal by the delay value.

Accordingly, a strobe output signal can have a prescribed delay in relation to a data output signal. Further, a deviation of timing caused by a skew between data and a strobe signal can be appropriately corrected. Thus, the data and the strobe signal can be appropriately synchronized and data transfer can be appropriately performed.

Figure 6B:
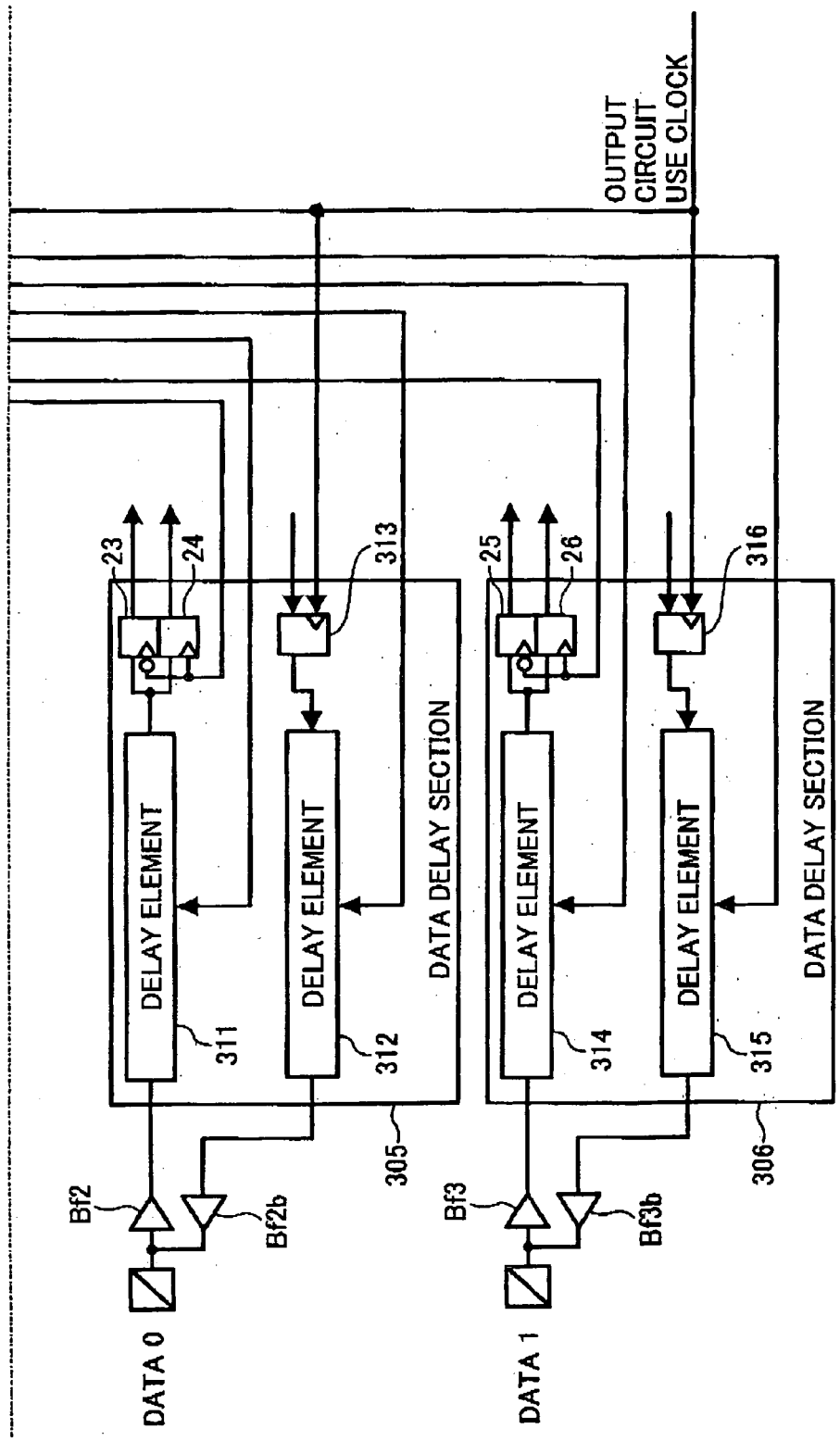

A fourth embodiment of an exemplary delay control apparatus is now described with reference to FIG. 6A and FIG. 6B.

As shown, a delay control apparatus 300 includes a master DLL 2, two delay setting value calculation circuits 201 and 202, and a strobe delay section 203 similar to the delay control apparatus 200 of the third embodiment. The delay control apparatus 300 further includes four delay setting value calculation circuits 301 through 304 and two data delay sections 305 and 306.

The data delay section 305 includes two flip-flops 23 and 24 similar to those in the data delay section 5 of the first embodiment, two delay elements 311 and 312, and a flip-flop 313.

The data delay section 306 includes two flip-flops 25 and 26 similar to those in the data delay section 5 of the first embodiment, two delay elements 314 (i.e., a data delay element) and 315 (i.e., a second data delay element), and a flip-flop 316.

The data delay setting value calculation circuits 301 to 304 respectively receive inputs of a delay value corresponding to one cycle of a reference clock input from the master DLL2 and data delay setting value. Each of the data delay setting value calculation circuits 301 to 304 calculates a corresponding delay value based on the data delay setting value and the delay values from the master DLL 2, and sets the calculation result to a corresponding one of the delay elements 311, 312, 314 and 315.

The delay element 311 delays data 0 upon input via the buffer Bf2 by the delay value set by the data delay setting value calculation circuit 301, and outputs the delaying result to the flip-flops 23 and 24. The delay element 314 delays data 1 upon input via the buffer Bf3 by the delay value set by the data delay setting value calculation circuit 302, and outputs the delaying result to the flip-flops 25 and 26.

The delay setting value calculation circuit 201 calculates a delay value for input use based upon the delay value input from the master DLL 2 and an input use delay setting value, and outputs such delaying result to a delay element 12 and the delay control circuit 15.

Further, the delay setting value calculation circuit 202 calculates a delay value for output use based upon the delay value input from the master DLL 2 and an output use delay setting value, and outputs such delaying result to the delay element 211.

The strobe control circuit 212 receives an input of an output use clock, and outputs a strobe output timing signal to the delay element 211 in response to the output circuit use clock.

The delay element 211 delays the strobe output timing signal input from the strobe control circuit 212 by a delay value input from the delay setting value calculation circuit 202 and returns the delaying result to the strobe signal line via the buffer Bf1b.

The flip-flops 313 and 316 receive the output circuit use clocks, and output a data output timing signal to the delay elements 312 and 315 per the output (circuit) use clock, respectively.

These delay elements 312 and 315 have the same functions as those 311 and 314, and delay the data output timing signal input from the flip-flops 313 and 316 by the same delay value as the delay elements 311 and 314, and return the delaying result to the data 0 and 1 lines via the buffers Bf2b and Bf3b, respectively.

Delay values respectively set to the delay elements 311, 312, 314 and 315 adjust skews of data input signals input to the plurality of data delay sections 305 and 306.

Accordingly, when the delay control apparatus 300 is arranged between an ASIC and a memory or the like, data skew caused therebetween can be adjusted.

Further, according to the delay control apparatus 300 of this embodiment, a plurality of data delay setting value calculation circuits 301 to 304 calculate delay values based upon delay values corresponding to integral multiple cycles of a clock and a delay setting value to either increase or decrease the delay value.

Further, the delay value calculation circuits 302 and 304 set the delay value to the delay elements 312 and 315 as second data delay elements.

As a result, a delay value can be set per data output signal, and a skew on a transmission channel after data output can be corrected, thereby appropriate data transfer is enabled.

A fifth embodiment of an exemplary electronic instrument employing an exemplary data delay apparatus is now described with reference to FIG. 7.

An electronic instrument 500 includes a CPU (Central Processing Unit) 501, a ROM (Read Only Memory) 502, and a plurality of registers 503 to 507 or the like. The CPU 501 reads and writes data from and to the memory 509 as an external control device via the delay control apparatus 400 and the plurality of registers 503 to 507 connected to the bus 508. Such a memory 509 can employ a DDR-SDRAM.

Figure 7:
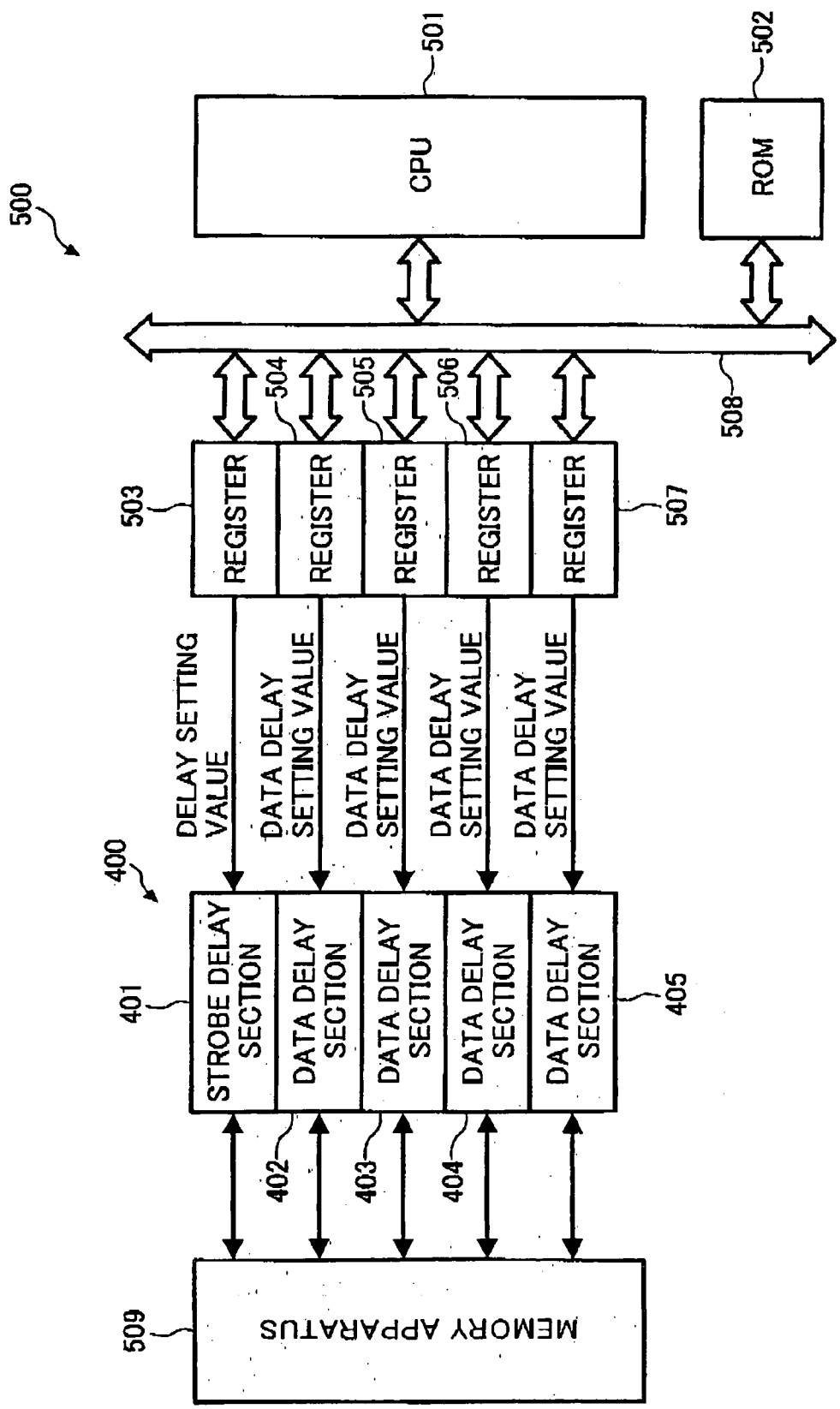
FIG. 7 illustrates an exemplary electronic instrument including a delay control apparatus according to a fifth embodiment.
Figure 8:
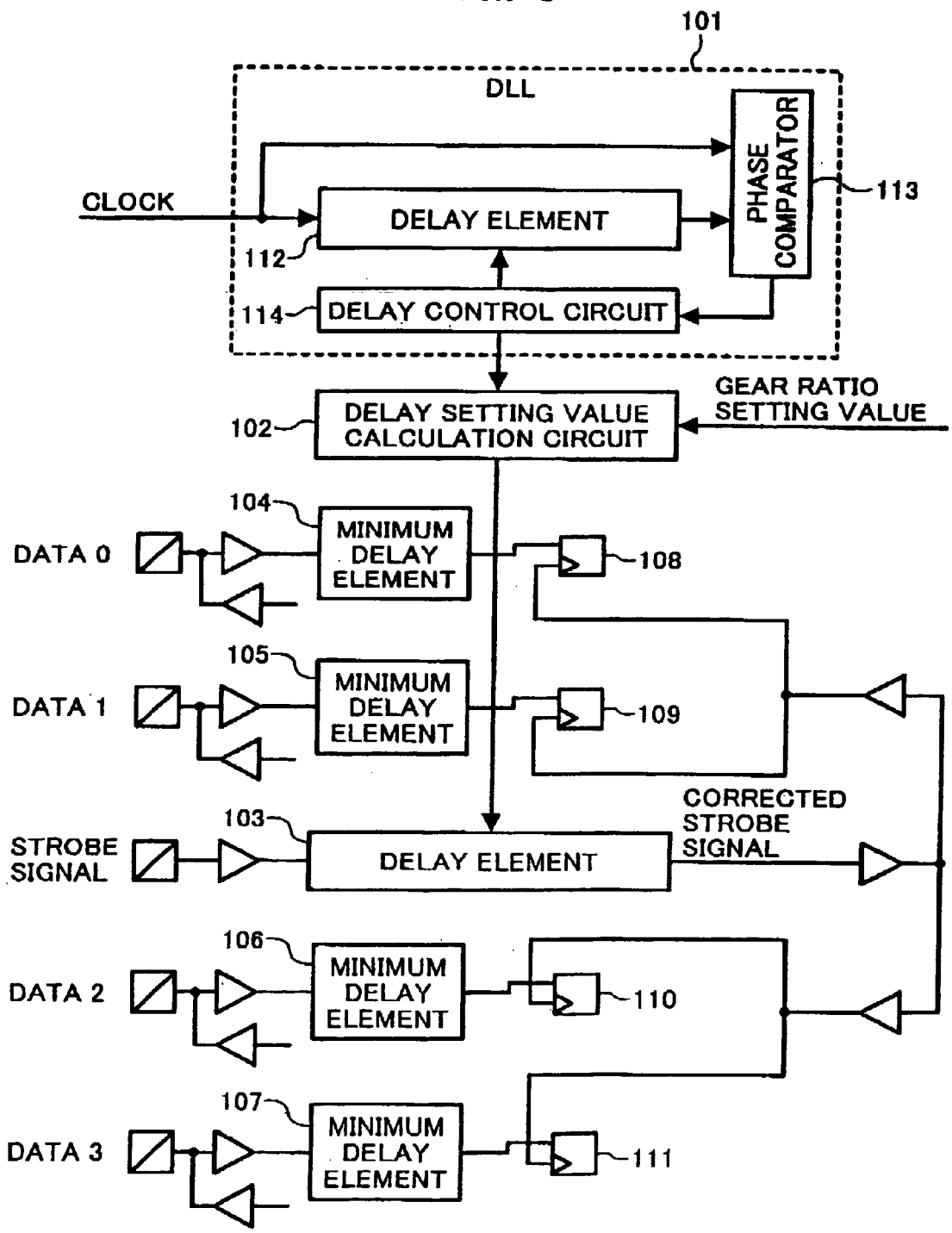
FIG. 8 illustrates an exemplary signal delay apparatus using a conventional DLL.
Figure 9:
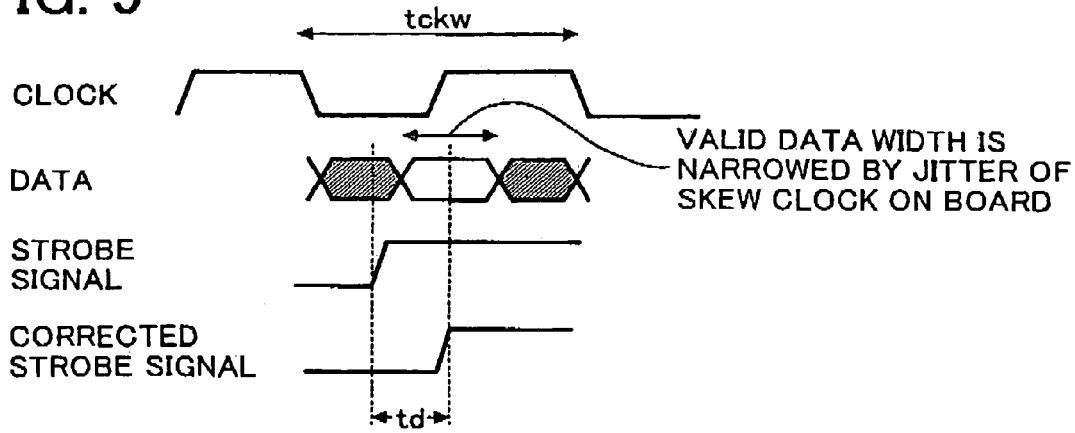
FIG. 9 illustrates timings of input data of FIG. 8.

The delay control apparatus 400 can employ the delay control apparatuses 100, 200 and 300 of the first to fourth embodiments, and includes a strobe delay section 401 and four data delay sections 402 to 405 as illustrated in FIG. 7.

A strobe delay setting value and a data delay setting value are set by the CPU 501 to the strobe delay setting section 401 and the data delay setting sections 402 to 405, respectively, via the registers 503 to 507.

The strobe delay setting value and data delay setting value are stored in a ROM 502 serving as an external nonvolatile memory. The CPU 501 reads and sets those values from the ROM 502 to the registers 503 to 507, respectively, when the electronic instrument 500 is turned ON or reset. These values are determined and written in the ROM 502 when a board of the electronic instrument 500 is designed in view of wiring skews of data and a delay of the data created from a strobe signal from the CPU 501 to the memory apparatus 509.

According to this embodiment, since the CPU 501 is enabled to set both the strobe delay setting value and the data delay setting value to the strobe delay section 401 and the data delay sections 402 to 405, respectively, the delay setting value can be set by software or the like. Further, a different value is optionally set per an instrument in view of a difference in design of an ASIC or a board.

Further, since the CPU 501 is enabled to read and set both a strobe delay setting value and the data delay setting value to the strobe delay section 401 and the data delay sections 402 to 405 from the ROM 502, the delay setting value corresponding to data skew on a board, which varies per an instrument can be appropriately set without changing main software. Further, a different value, can be optionally set at low cost in accordance with a difference in ASIC design or board design.

Numerous additional modifications and variations are possible in light of the above teachings. It is therefore to be understood that within the scope of the appended claims, the techniques of the present application may be practiced otherwise than as specifically described herein. For example, elements and/or features of different illustrative embodiments may be combined with each other and/or substituted for each other within the scope of this application and the appended claims.

This patent document claims priority under 35 USC § 119 to Japanese Patent Application No. 2004-189213 filed on Jun. 28, 2004, the entire contents of which are herein incorporated by reference.

What is claimed is:

1. A data delay control apparatus, comprising:
   a selection device configured to select and output one of a strobe signal and a reference clock in accordance with a selection signal;
   first and second delay elements, each configured to receive and delay the strobe signal and the reference clock by a prescribed value;
   a phase comparing device configured to compare phases of outputs of the first and second delay elements;
   a delay value changing device configured to change the prescribed delay value of the second delay element; and
   a prescribed number of flip-flops, each configured to input data upon receiving the strobe signal from the second delay element, said prescribed number corresponding to a number of data inputs;
   wherein said second delay element delays the strobe signal by the prescribed delay value and outputs the delayed strobe signal to the flip-flops when the selection device selects the strobe signal, and
   wherein said phase comparing device compares reference clocks output from the first and second delay elements, and said delay control device changes the prescribed delay value of the second delay element in accordance with the comparison result of the phase comparing device when the selection device selects the reference clock.

2. The data delay control apparatus according to claim 1, wherein an output of said second delay element is input to the phase comparing device and flip-flops through respective routes via at least one buffer, and said respective routes collectively form a symmetric tree creating substantially the same delay.

3. The data delay control apparatus according to claim 1, further comprising at least two data delay elements connected to input terminals of the flip-flops, each data delay element causing a minimum delay corresponding to the least value delayable by the first and second delay elements.

4. The data delay control apparatus according to claim 1, further comprising a delay setting value calculation device configured to calculate and set a prescribed value to the first delay element and the delay control device by multiplying an integral multiple cycle of the reference clock and a delay setting value.

5. The data delay control apparatus according to claim 4, wherein said delay setting value is externally set from a control device to the delay setting value calculation device.

6. The data delay control apparatus according to claim 5, wherein said delay setting value is set by reading the delay setting value stored in an externally attached non-volatile memory.

7. The data delay control apparatus according to claim 1, wherein the selection device receives a correction signal and selectively outputs the reference clock when the correction signal is in one of high and low levels.

8. The data delay control apparatus according to claim 1, wherein said delay control apparatus is connected to a memory of a DDR-SDRAM and executes delay control of data and a strobe signal when the DDR-SDRAM is accessed.

9. A data delay control apparatus comprising:
a selection device configured to receive a strobe signal and a reference clock, and select and output one of the strobe signal and reference clock in accordance with a selection signal;
first and second delay elements, each configured to receive and delay the strobe signal and the reference clock by a prescribed value;
a phase comparing device configured to compare phases of outputs from the first and second delay elements;
a delay value calculation device configured to calculate and set a prescribed delay value of the first delay element by multiplying an integral multiple cycle of the reference clock and a delay setting value;
a delay value changing device configured to change the prescribed delay value of the second delay element; and
a prescribed number of flip-flops, each configured to input data upon receiving the strobe signal from the second delay element, said prescribed number corresponding to a number of inputs of the data;
wherein said the second delay element delays and outputs the strobe signal by the prescribed value to the flip-flops when the selection device selects the strobe signal, and wherein said phase comparing device compares a clock output from the first delay element having the prescribed delay calculated and set by the delay setting value calculation device with that output from the second delay element, and said delay control device changes the prescribed delay value of the second delay element in accordance with the comparison result of the phase comparing device when the selection device selects the reference clock.

10. The data delay control apparatus according to claim 9, wherein an output of said second delay element is input to the phase comparing device and flip-flops through respective routes via at least one buffer, wherein said respective routes collectively form a symmetric tree causing substantially the same delay.

11. The data delay control apparatus according to claim 9, further comprising at least two data delay elements connected to input terminals of the flip-flops, each data delay element causing a minimum delay, said minimum delay corresponding to the least value delayable by the first and second delay elements.

12. The data delay control apparatus according to claim 11, further comprising a plurality of data delay value calculation devices, each data delay value calculation device being configured to calculate a delay value by multiplying an integral multiple cycle of the reference clock and a delay setting value, wherein one of the data delay value calculation devices sets a calculation result to the first delay element, and the remaining data delay value calculation devices set a calculation result to data delay elements.

13. The data delay control apparatus according to claim 12, wherein one of said at least one data delay value calculation devices sets a calculation result to the second data delay element.

14. The data delay control apparatus according to claim 9, further comprising:
a strobe delay element configured to delay a strobe signal for output use by a prescribed value; and
at least one strobe delay value calculation device configured to calculate a delay value by multiplying an integral multiple cycle of the reference clock and a delay setting value;
wherein said strobe delay value calculation device sets a calculation result to the strobe delay element.

15. The data delay control apparatus according to claim 14, further comprising at least two data delay elements, each delaying data for output use by a minimum value corresponding to the least value delayable by the data delay element, wherein a number of said at least two data delay elements is the same as the number of the delay elements for input use.

* * * * *